United States Patent [19]
Cernea et al.

[11] Patent Number: 6,091,633
[45] Date of Patent: Jul. 18, 2000

[54] MEMORY ARRAY ARCHITECTURE UTILIZING GLOBAL BIT LINES SHARED BY MULTIPLE CELLS

[75] Inventors: Raul-Adrian Cernea, Santa Clara; George Samachisa, San Jose, both of Calif.

[73] Assignee: SanDisk Corporation, Sunnyvale, Calif.

[21] Appl. No.: 09/370,775

[22] Filed: Aug. 9, 1999

[51] Int. Cl.$^7$ .................................................. G11C 16/04
[52] U.S. Cl. .............................. 365/185.13; 365/185.2; 365/185.6; 365/185.12; 365/185.33; 365/63; 365/72; 365/104; 257/314; 257/315
[58] Field of Search .......................... 365/185.2, 185.6, 365/185.11, 185.12, 185.13, 185.33, 63, 72, 104; 257/314, 315

[56] References Cited

U.S. PATENT DOCUMENTS

| | | | |
|---|---|---|---|
| 4,336,603 | 6/1982 | Kotecha et al. | 365/185.3 |
| 4,380,057 | 4/1983 | Kotecha et al. | 365/184 |
| 4,417,264 | 11/1983 | Angle | 365/185.14 |
| 4,733,394 | 3/1988 | Giebel | 714/711 |
| 4,855,955 | 8/1989 | Cioaca | 365/185.19 |
| 5,003,510 | 3/1991 | Kamisaki | 365/189.01 |
| 5,021,999 | 6/1991 | Kohda et al. | 365/185.03 |
| 5,043,940 | 8/1991 | Harari | 365/185.03 |
| 5,070,032 | 12/1991 | Yuan et al. | 438/267 |
| 5,095,344 | 3/1992 | Harari | 257/328 |
| 5,159,570 | 10/1992 | Mitchell et al. | 365/185.03 |
| 5,172,338 | 12/1992 | Mehrotra et al. | 365/185.03 |
| 5,278,439 | 1/1994 | Ma et al. | 257/319 |
| 5,297,148 | 3/1994 | Harari et al. | 714/710 |
| 5,313,421 | 5/1994 | Guterman et al. | 365/185.15 |
| 5,315,541 | 5/1994 | Harari et al. | 365/185.13 |
| 5,343,063 | 8/1994 | Yuan et al. | 257/317 |

(List continued on next page.)

FOREIGN PATENT DOCUMENTS

| | | | |
|---|---|---|---|
| 0051158 | 9/1984 | European Pat. Off. | G11C 11/34 |
| 55-043862 | 3/1980 | Japan | H01L 29/78 |
| 58-222561 | 12/1983 | Japan | H01L 27/10 |
| 7-226449 | 8/1995 | Japan | H01L 21/8247 |
| WO 95/19047 | 7/1995 | WIPO | H01L 29/68 |

OTHER PUBLICATIONS

Alberts et al., "Multi–Bit Storage FET EAROM Cell", IBM Technical Disclosure Bulletin, vol. 24, No. 7A, Dec. 1981, pp 3311–3314.

Kamiya et al., "EPROM Cell with High Gate Injection Efficiency", Int'l Electron Device Mtg., Technical Digest, Dec. 13, 1982, pp. 741–744.

Ma et al., "A Dual–bit Split–Gate EEPROM (DSG) Cell in Contactless Array for Single–Vcc High Density Flash Memories", 1994 IEEE pp. 3.5.1 thru 3.5.4.

Pein et al, "Performance of the 3–D Sidewall Flash EPROM Cell", International Electron Devices Meeting Technical Digest, Washington DC, Dec. 5–8, 1993, pp. 2.1.1 thru 2.1.4.

Kuo et al., "TEFET—A High Density, Low Erase Voltage, Trench Flash EEPROM", 1994 Symposium on VLSI Technology, Honolulu, Jun. 7–9, 1994, pp. 51–52.

*Primary Examiner*—Andrew Q. Tran
*Attorney, Agent, or Firm*—Majestic, Parsons, Siebert & Hsue

[57] ABSTRACT

As a specific application of a new memory architecture, an array of non-volatile dual floating gate memory cells is arranged on a semiconductor substrate with global bit lines extending in a column direction that are either permanently connected, or connectable through transistor switches, to short source and drain diffusions that are oriented in the row direction between the global bit lines. Multiple columns of memory cells are positioned between the global bit lines. Bit selection lines oriented in the column direction are connected to the gates of select transistors within the memory cells. Word lines individually extend over one or two rows of floating gates. This arrangement provides a very small array that allows for future scaling. It also enables the use of metal lines strapped to the global bit line diffusions, and to polysilicon word lines to reduce their resistance, without imposing their larger pitch on other array elements.

30 Claims, 7 Drawing Sheets

U.S. PATENT DOCUMENTS

| | | | |
|---|---|---|---|
| 5,364,806 | 11/1994 | Ma et al. | 438/266 |
| 5,411,905 | 5/1995 | Acovic et al. | 438/156 |
| 5,412,600 | 5/1995 | Nakajima | 365/185.17 |
| 5,414,693 | 5/1995 | Ma et al. | 365/185.1 |
| 5,486,714 | 1/1996 | Hong | 257/321 |
| 5,576,567 | 11/1996 | Mori | 257/316 |
| 5,606,521 | 2/1997 | Kuo et al. | 257/315 |
| 5,616,510 | 4/1997 | Wong | 438/259 |
| 5,643,814 | 7/1997 | Chung | 438/259 |
| 5,661,053 | 8/1997 | Yuan | 438/257 |
| 5,712,180 | 1/1998 | Guterman et al. | 438/263 |
| 5,714,412 | 2/1998 | Liang et al. | 438/266 |
| 5,786,612 | 7/1998 | Otani et al. | 257/316 |
| 5,812,449 | 9/1998 | Song | 365/185.03 |
| B1 5,172,338 | 12/1992 | Mehrotra et al. | 365/185.03 |

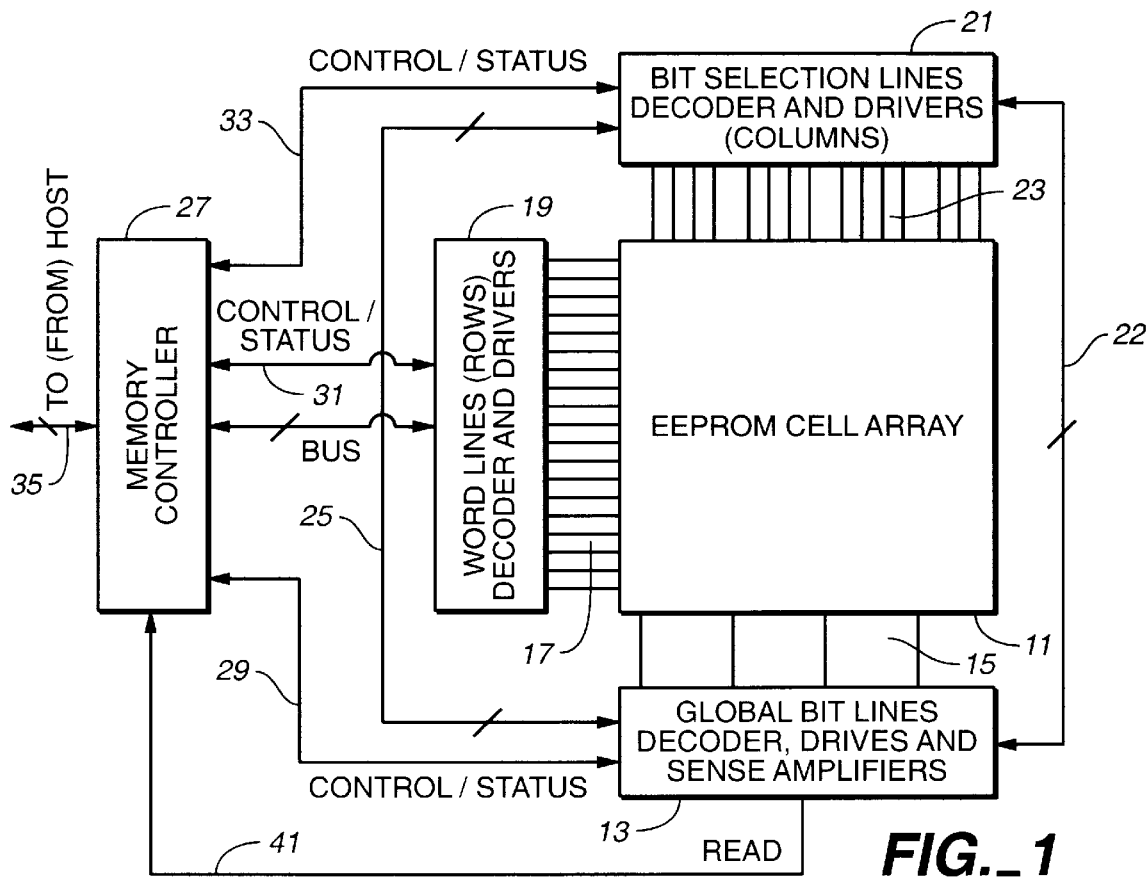
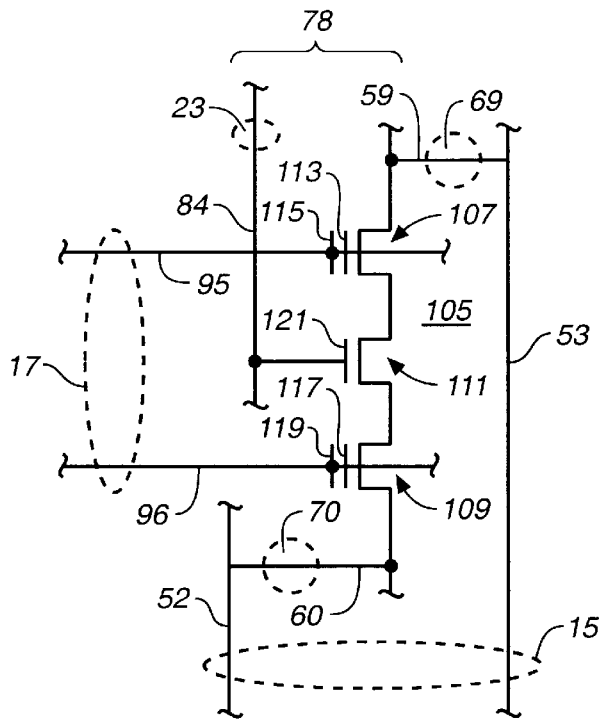

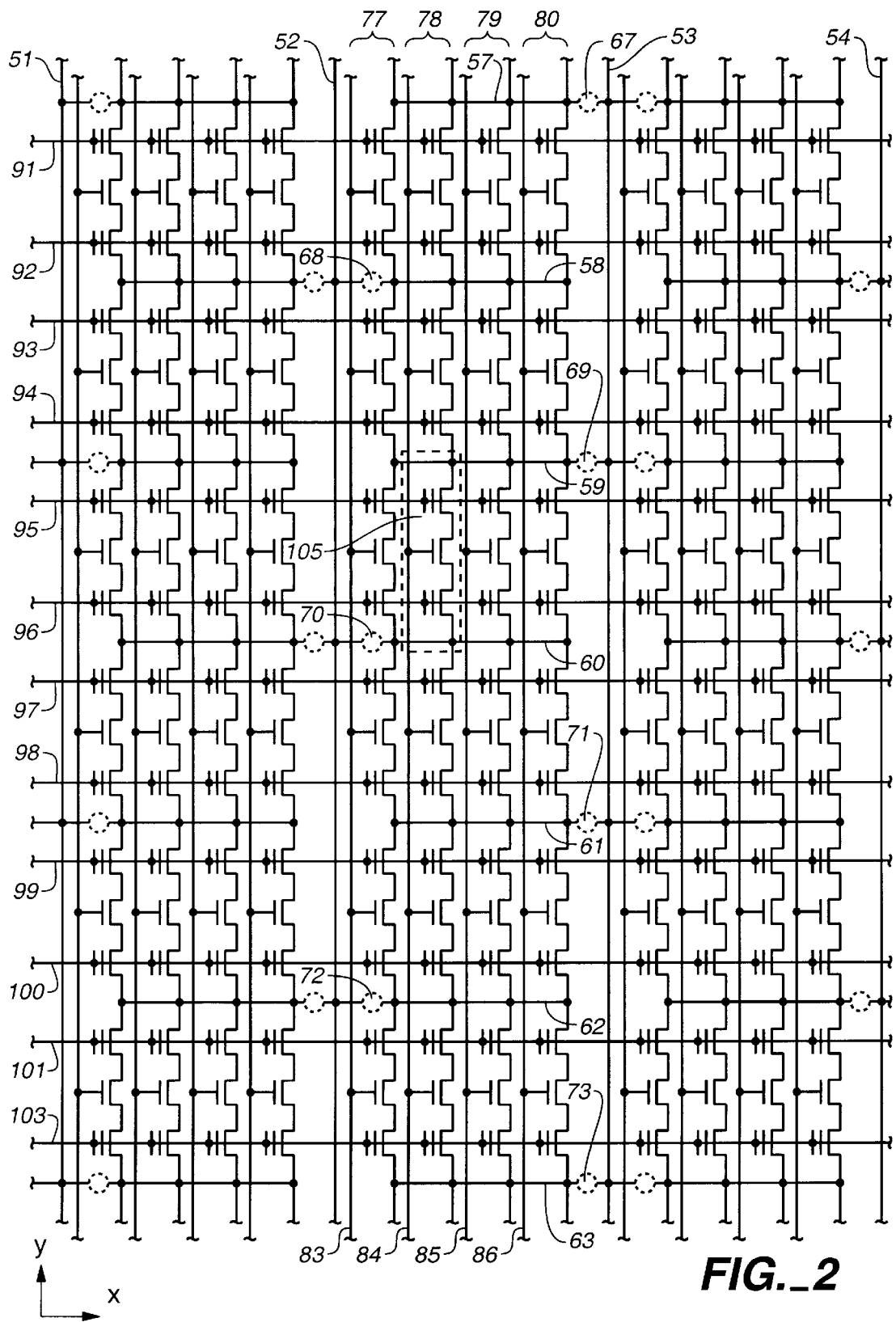
FIG._2

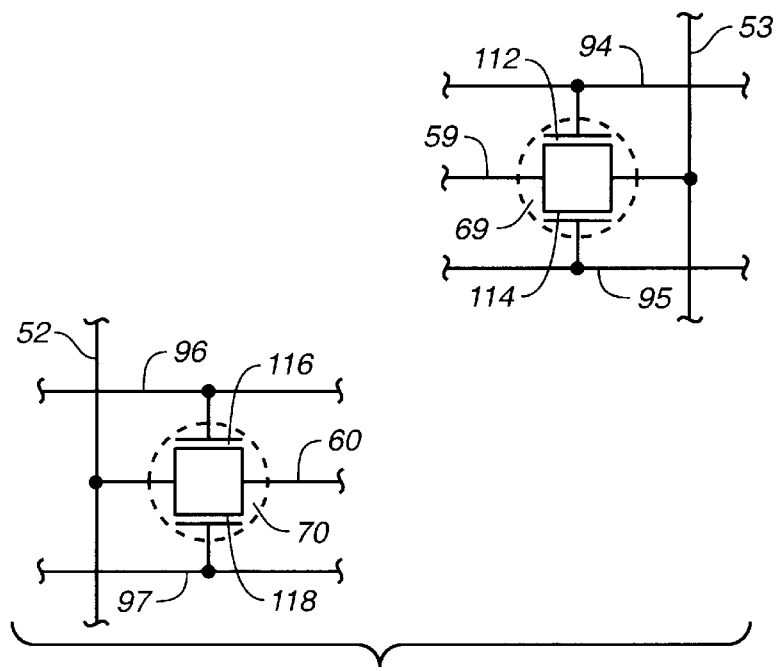
FIG._4
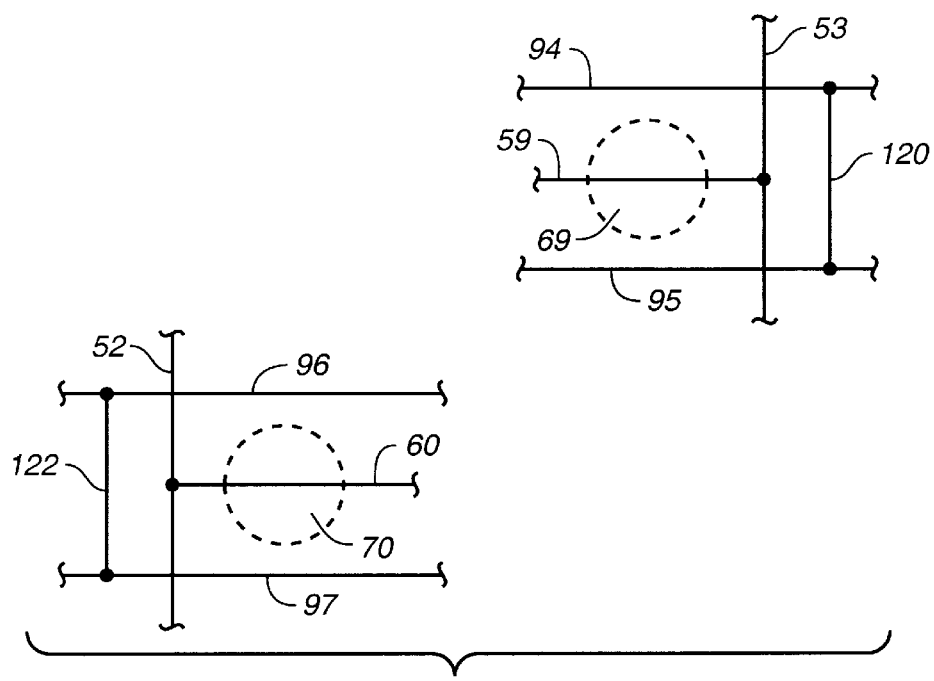
FIG._5

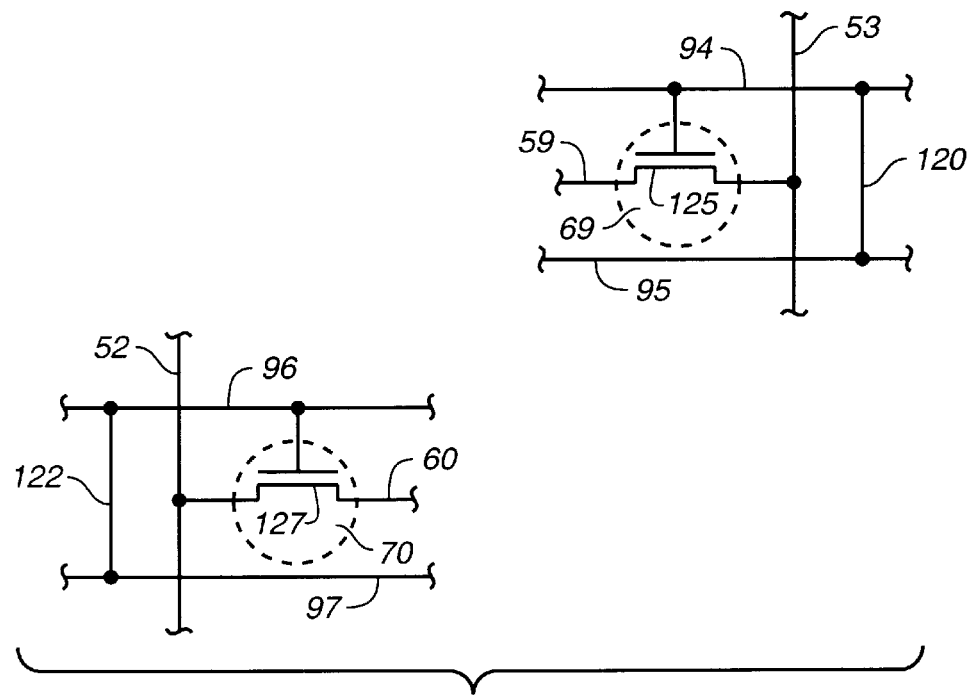
FIG._6
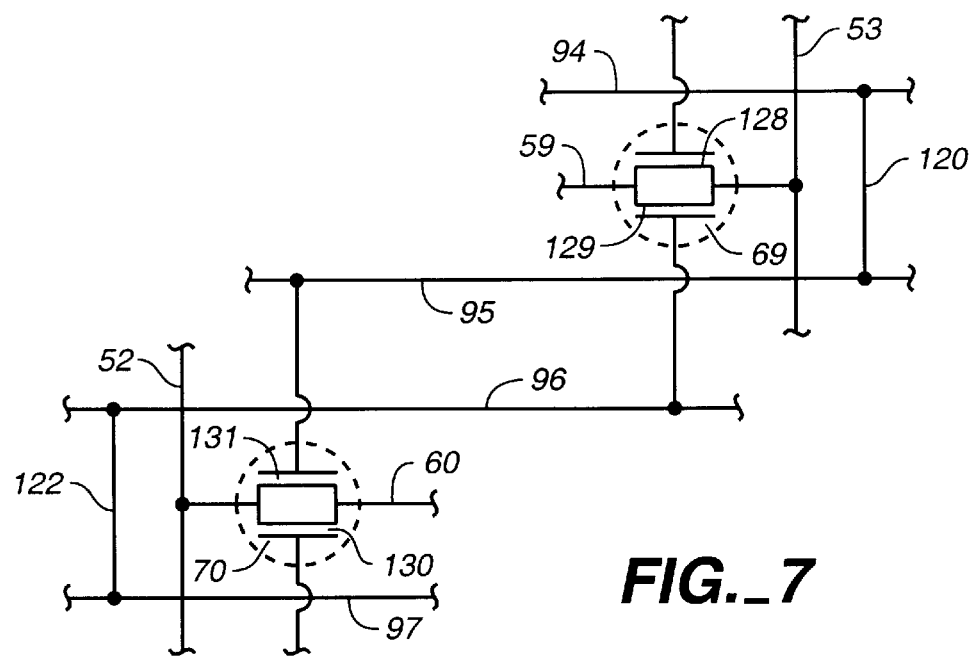
FIG._7

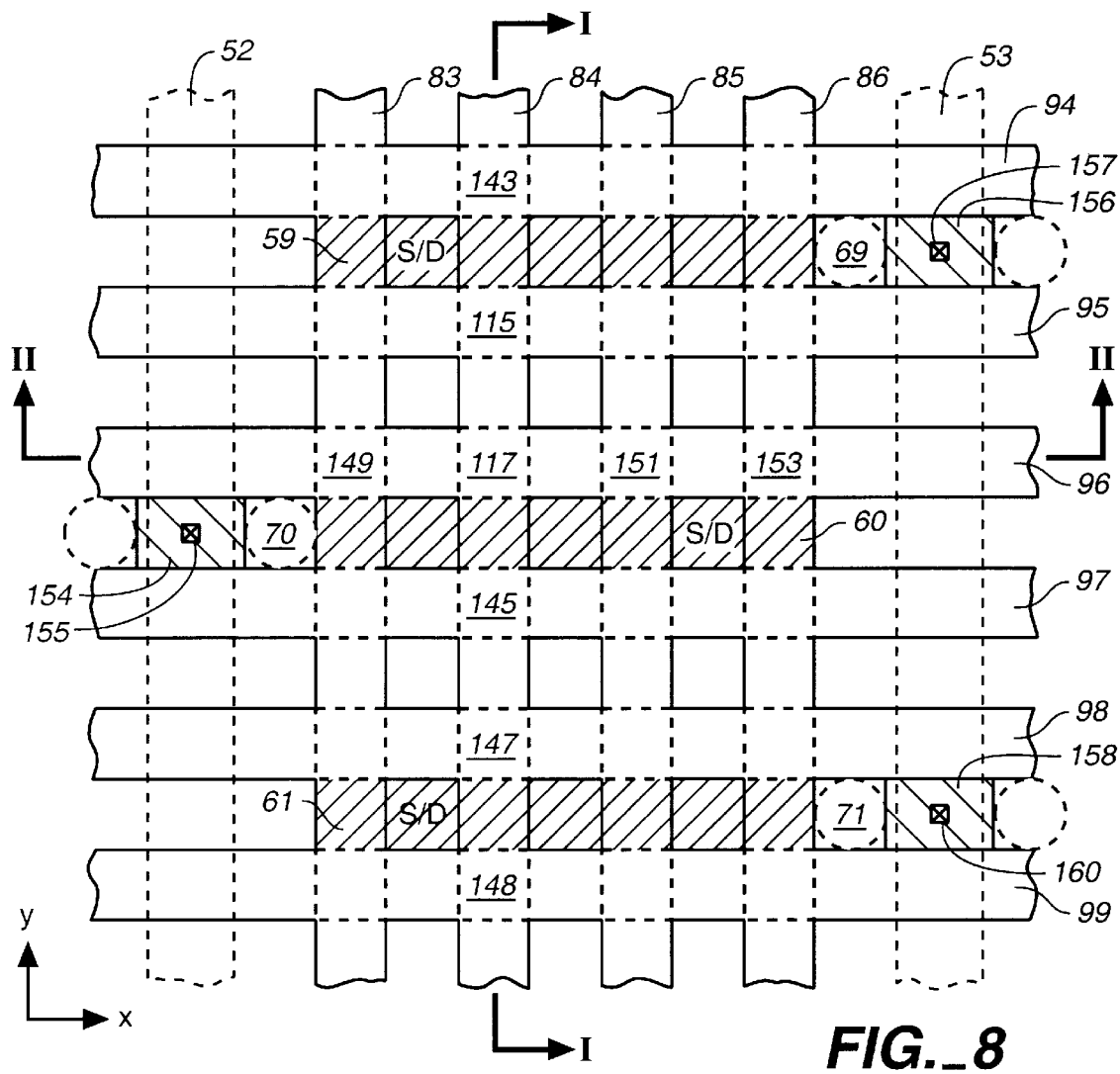
FIG._8
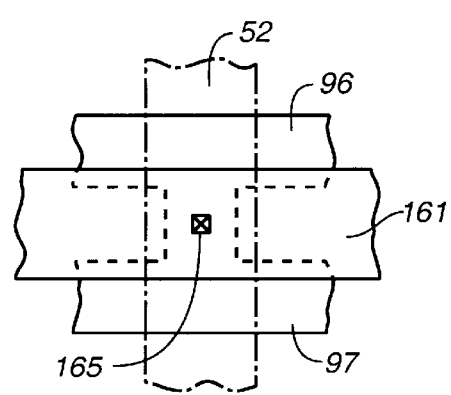
FIG._10

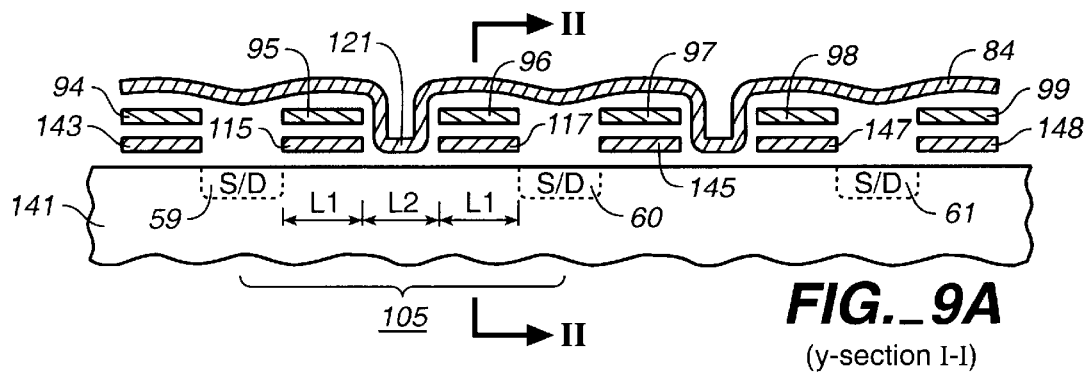
FIG._9A
(y-section I-I)
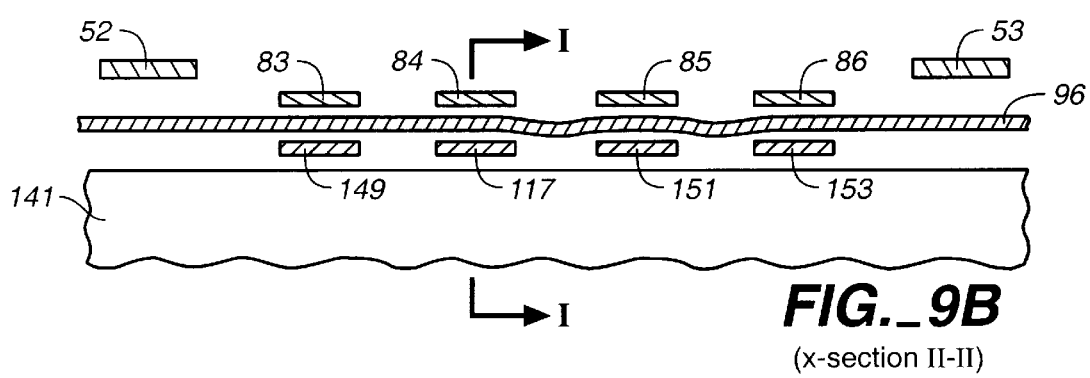
FIG._9B
(x-section II-II)
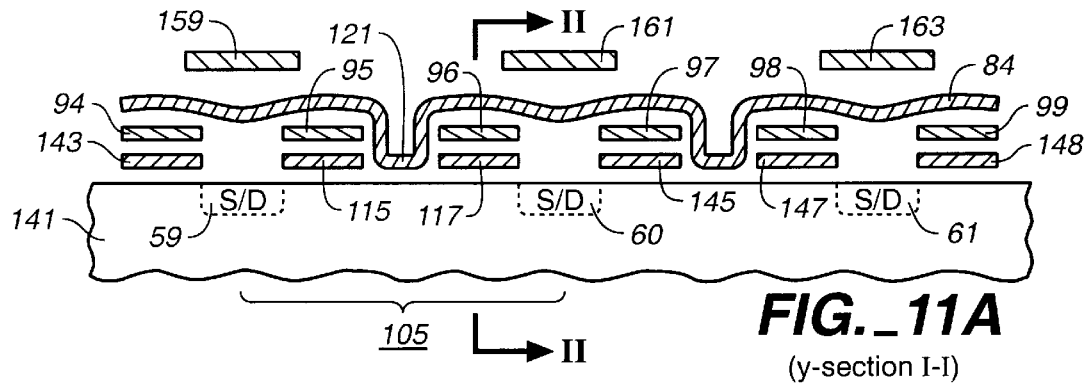
FIG._11A
(y-section I-I)
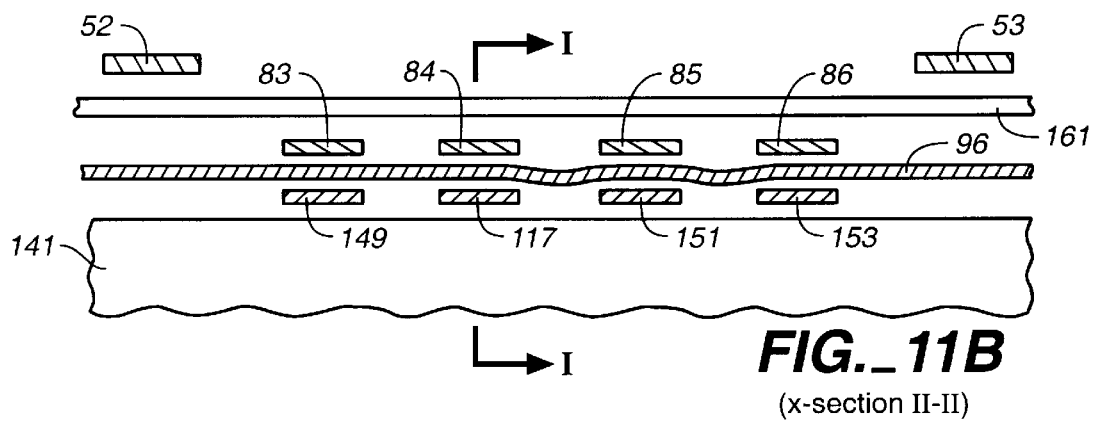
FIG._11B
(x-section II-II)

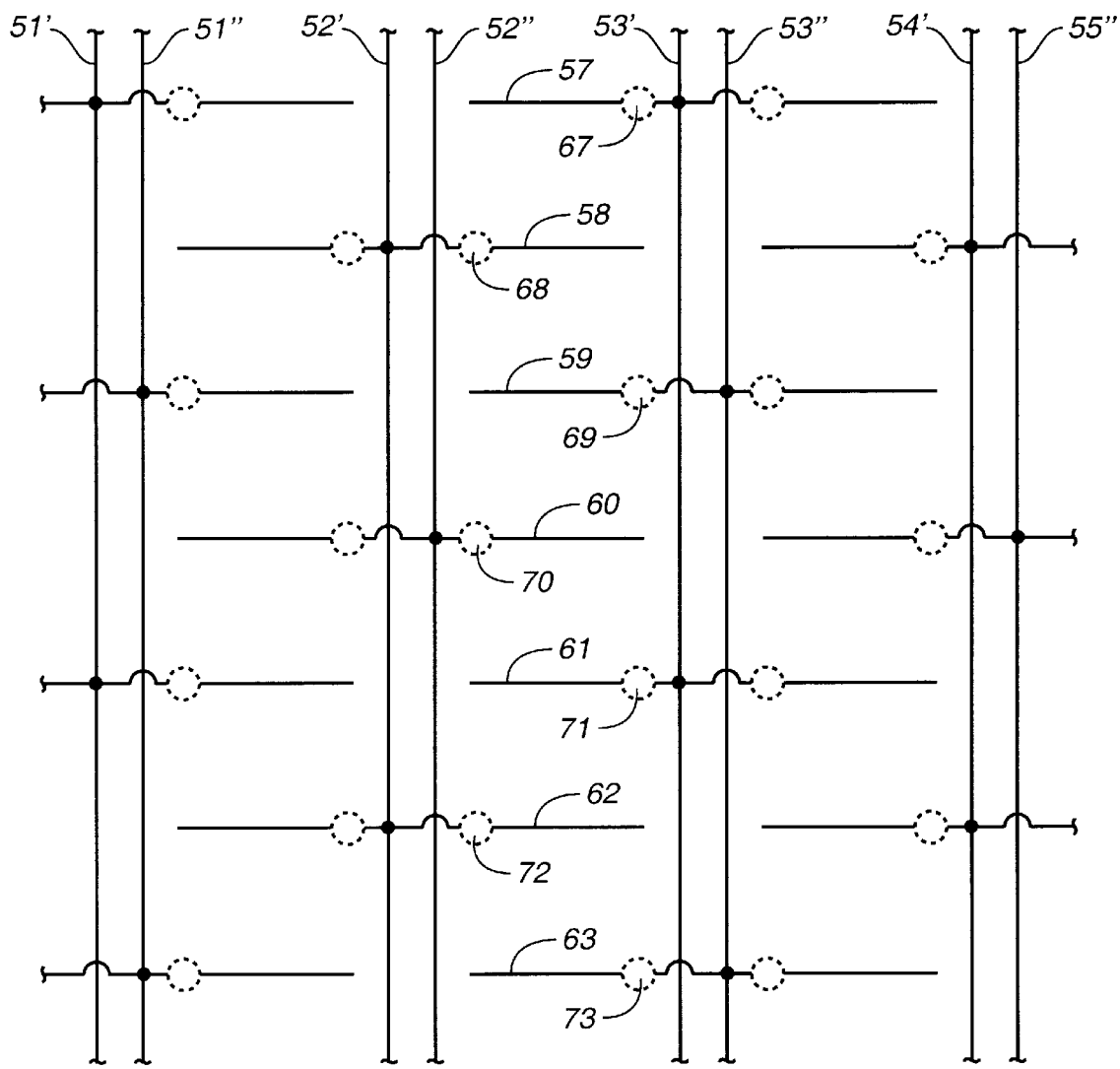
FIG._12

MEMORY ARRAY ARCHITECTURE UTILIZING GLOBAL BIT LINES SHARED BY MULTIPLE CELLS

BACKGROUND OF THE INVENTION

This invention relates generally to the architecture of arrays of semiconductor memory cells, and, more specifically, to non-volatile memory system arrays. As a highly useful application, the architecture is utilized in and tailored to arrays of flash EEPROM (Electrically Erasable and Programmable Read-Only Memory) cells.

Non-volatile memory arrays take many forms and utilize various technologies. Non-volatile memory systems in the form of small cards have recently become quite popular and commercially successful. The technology most commonly utilized in such memory cards is the flash EEPROM technology. One specific flash EEPROM implementation includes an array of cells having a "split-channel" (or "split-gate") between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in copending U.S. Pat. application Ser. No. 09/239,073, filed Jan. 27, 1999, which patents and application are incorporated herein by this reference.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described in U.S. Pat. No. 5,313,421, which patent is incorporated herein by this reference.

In this type of cell array, the floating gate of a cell is programmed by injecting electrons from the substrate to the floating gate. This is accomplished by having the proper doping in the channel region and applying the proper voltages to the source, drain and remaining gate(s). So called "source side" injection is preferred, being described in the foregoing U.S. Pat. No. 5,313,421.

In large arrays, it is often desirable to be able to isolate segments of the array from each other. Segmentation reduces the capacitance of long conductors and diffusions by reducing their lengths, thus increasing the speed of operation of the array. Further, the likelihood of disturbing the programmed state of cells is reduced if a portion of the array containing cells being programmed, read or erased is isolated from the rest of the array. Segmentation also allows defective portions of an array to be isolated. Column segmentation of bit line diffusions is described in U.S. Pat. No. 5,315,541, which patent is incorporated herein by this reference.

Two techniques of removing charge from floating gates to erase memory cells are used in both of the two types of memory cell arrays described above. One is to erase to the substrate by applying appropriate voltages to the source, drain and other gate(s) to cause electrons to tunnel through a portion of a dielectric layer between the floating gate and the substrate. The other erase technique is to transfer electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sector's worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

A flash EEPROM system having an array of dual floating gate memory cells along with the storage of multiple states on each floating gate significantly increases the data storage density of the array. Two floating gates are included over the channel of each cell between its source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. This cell array architecture and operating techniques are described in U.S. Pat. No. 5,712,180 and copending application Ser. No. 08/910,947, filed Aug. 7, 1997, which patent and application are incorporated herein by this reference. Efforts continue to design memory cell arrays having an increased data storage density and that can be also be made smaller as further improvements in processing technology become available.

SUMMARY OF THE INVENTION

Accordingly, applying the present invention to a specific non-volatile memory technology as an example, memory cells that individually have one or more floating gate transistors and a select transistor connected in series between source and drain diffusions are oriented in columns. In a preferred form, the array cells each have two floating gates positioned adjacent respective source and drain diffusions with the select transistor in the middle. Word lines extend along and are capacitively coupled with rows of floating gates, while the select transistors of the cells of each column are driven together by the voltage on a common bit selection line. A particular floating gate is addressed for programming or reading by coupling an appropriate voltage to it through the word line of its row and turning on the select transistor of the cell in which the floating gate resides by placing an appropriate voltage on its column bit selection line. The source and drain diffusions extend in the row direction between global bit lines to which they are connectable, the global bit lines being oriented in the column direction. One or more floating gates in a row between adjacent global bit lines may be programmed at the same time, while a single floating gate between one or two adjacent global bit lines is read at a time through sense amplifiers connectable to the global bit lines.

This array architecture has many advantages and additional features, some of which are briefly summarized as follows:

1. The circuit areas required for both individual cells and the array are very small. The array can be implemented by a self-aligned process that keeps it small and allows its size to be scaled downward as improved processing techniques become available. Because the global bit lines are spaced apart by multiple columns of cells, metal lines included to periodically strap global bit line diffusions, with their larger pitch than other elements, do not limit other scaling of the array.

2. Because of the column oriented select transistor bit selection lines, only one cell of a selected row is enabled for conduction between its source and drain during programming and reading operations, thus minimizing disturbs of the states of other floating gates of non-selected cells in the selected row. Additionally, in some of the embodiments, the source and drain diffusions are selectively connected to their respective global bit lines by pass transistors that are operated to enable only the cells containing the addressed row of floating gates. This further reduces, if not eliminates, disturbs in other cells in the same column as an addressed cell, since no voltages are connected to their sources and drains.

3. In some of the embodiments, pairs of word lines on opposite sides of source/drain diffusions are connected together. This reduces the complexity of the row decoder, since there are only one-half the number of word lines to be addressed. It also allows a metal line to be provided for each pair of polysilicon word lines since the number of metal lines is then only one-half the number of word lines and can be included in the same space as the word lines even though the metal lines cannot be made by existing processing techniques to be as narrow as the polysilicon word lines. The word lines, and thus their associated rows of floating gates, may then be made longer since the relatively high resistance and time constant of the polysilicon word lines is overcome by periodically connecting them to their associated metal lines. In addition, since there are only one-half the number of metal lines as polysilicon lines, the polysilicon and remaining silicon elements are scalable without being restricted by limitations of reducing the widths of metal lines.

4. The minimum number of floating gates that form a block of floating gates that are erasable together is the number of floating gates that are selected by a common word line. If an individual row of floating gates has a separately addressable word line, then the size of the block is the number of floating gates in that row. If two adjacent word lines on opposite sides of the source/drain diffusions are connected together, as discussed above, the size of the block is equal to the number of floating gates the two rows addressed by the word lines. This architecture makes it very easy to configure and use blocks of either a small or large number of memory cells, depending upon the application.

Copending patent applications Ser. Nos. 09/343,328 and 09/343,493, both filed Jun. 30, 1999, and commonly assigned herewith, describe dual floating gate memory cell arrays with steering gates shared by adjacent floating gates across intermediate source and drain diffusions. Certain aspects of those disclosures, particularly processing techniques, will be recognized as also being applicable to the modified dual-gate cell memory arrays described herein. Accordingly, these applications are hereby expressly incorporated herein by this reference.

Additional features and advantages of the present invention are included in the following description of specific embodiments thereof, which description should be taken in conjunction with the accompany drawings.

BRIEF DESCRIPTION OF THE DRAWINGS

FIG. 1 illustrates in block diagram form a flash EEPROM system utilizing the present invention;

FIG. 2 is a general electrical circuit schematic representation of the memory cell array of FIG. 1;

FIG. 3 is a portion of the schematic of FIG. 2, showing connections for operating one of its memory cells;

FIG. 4 shows a specific circuit connecting source and drain diffusions of the schematic of FIG. 2, according to a first embodiment;

FIG. 5 shows another specific circuit connecting source and drain diffusions of the schematic of FIG. 2, according to a second embodiment;

FIG. 6 shows yet another specific circuit connecting source and drain diffusions of the schematic of FIG. 2, according to a third embodiment;

FIG. 7 shows a further specific circuit connecting source and drain diffusions of the schematic of FIG. 2, according to a fourth embodiment;

FIG. 8 is a plan view of an example integrated circuit layout that implements the array of FIG. 2;

FIGS. 9A and 9B are sectional views of the integrated circuit layout of FIG. 8, taken at respective Sections I—I and II—II thereof, that implements the circuit embodiment of FIG. 4; and FIG. 10 is a plan view of an integrated circuit layout connection of elements in an implementation of the circuit embodiments of any of FIGS. 5–7;

FIGS. 11A and 11B are sectional views of the integrated circuit layout of FIG. 8, taken at respective Sections I—I and II—II thereof, when utilizing the connection of FIG. 10; and FIG. 12 shows a modification of a portion of the array architecture of FIG. 2.

DESCRIPTION OF THE PREFERRED EMBODIMENTS

Before describing the improved arrays of the present invention, an example memory system incorporating the various aspects of the present invention is generally illustrated in the block diagram of FIG. 1. A large number of individually addressable memory cells 11 are arranged in a regular array of rows and columns, although other physical arrangements of cells are certainly possible. Global bit lines, extending in a columnar direction across the array of cells 11 and connected with its source and drain diffusions, are electrically connected with a global bit line decoder 13 through lines 15. The decoder includes drivers that individually set voltages on the global bit lines, as well as sense amplifiers to detect the states of addressed cells during a read operation. Word lines, extending along rows of floating gates within the array 11, are electrically connected through lines 17 to a word line decoder and driver circuit 19. Bit selection lines, which extend along columns of memory cells in the array 11 in between global bit lines to form select gates of the individual cells in each column, are electrically connected to a bit selection line decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the global bit lines and the bit selection lines are coordinated through a bus 22 that interconnects the decoder and driver circuits 13 and 21. In practice, the decoder and driver circuits 13 and 21 are combined into a single circuit positioned along one side of the array 11 but are shown separately in FIG. 1 in order to illustrate the different functions which are performed.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the Compact-Flash™ Association, the MMC™ Association, and others. When in a card format, the lines 35 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 1 are permanently embedded in host devices.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including the status of voltage levels and other array parameters, are provided by the array 11 to the controller 27 over the same control and status lines 29, 31 and 33. A plurality of sense amplifiers within the circuit 13 receive current or voltage levels of the array global bit lines that are indicative of the states of addressed memory cells within the array 11, and provides the controller 27 with information about those states over lines 41 during a read operation. One sense amplifier if preferably included for each of the global bit lines of the array that extend along a row of floating gate storage devices within a block of such devices. A large number of sense amplifiers are usually used in order to be able to read the states of a large number of memory cells in parallel. During reading and program operations, one row of floating gate devices is typically addressed at a time through the circuits 19 for simultaneously accessing a number of floating gates in the addressed row that are selected by the circuits 13 and 21. In the memory architecture example described herein, the floating gates are erased to the substrate. One or more word lines are simultaneously driven negative with respect to the substrate during an erase operation by the circuits 19. The number of floating gates that are erased at a time define a block size, and may be confined to those of one or two rows.

An equivalent circuit of an example of the cell array 11 that implements the various aspects of the present invention is provided in FIG. 2, wherein the memory cells and their floating gates are shown to be oriented in the rows and columns of a physical integrated circuit layout. The diffusions and conductive lines of FIG. 2 are similarly oriented in the manner of a physical layout. Global bit lines 51–54 are elongated in the y-direction of the array and spaced apart in the x-direction, wherein the x and y directions are perpendicular to each other. A plurality of columns of memory cells are positioned between each pair of adjacent global bit lines, four columns 77–80 being illustrated between global bit lines 52 and 53 for the purpose of this description. In a usual implementation, more than four columns are positioned between adjacent global bit lines but as few as two such columns may also be utilized. The pattern of array cells between the global bit lines 52 and 53 is repeated across the structure in the x-direction between others of repetitively occurring global bit lines. It is the global bit lines that are connected to sense amplifiers in the circuit 13 (FIG. 1) during the reading of the states of the memory cells.

Source and drain diffusions 57–63 are elongated in the x-direction and spaced apart in the y-direction. The source and drain diffusions 57–63 are connected through respective connection devices 67–73 to only one of the global bit lines 52 and 53 that bound the diffusions. The connection devices 67–73 may be, as described further below, a permanent connection (see FIG. 5) or include the use of pass transistors (see FIGS. 4, 6 and 7). The lengths of the source and drain diffusions 57–63 extend less than the distance between adjacent global bit lines 52 and 53. These diffusions are connected, alternately across the y-direction, with one or the other of the bounding global bit lines 52 and 53. One memory cell is formed in each column between adjacent pairs of diffusions that are connected to a different one of the two bounding global bit lines.

Each of the columns 77–80 of memory cells also includes a respective one of a plurality of bit selection lines 83–86. Each of these bit selection lines is connected to a control gate of a select transistor within each of the memory cells in its column. The voltage on a bit selection line thus determines whether channels of the cells in its column can conduct electrons between their respective source and drain diffusions when other voltage conditions are met. Each memory cell includes at least one floating gate transistor formed in series with the select transistor between its source and drain diffusions, and preferably two floating gate transistors. More than two floating gate transistors are also possible in a longer series connection of floating gate transistors and one select transistor between adjacent source and drain diffusions.

The memory cells are arranged in the columns so that their floating gates form rows extending in the x-direction. Each row of floating gates has one of conductive word lines 91–103 extending along its length with a capacitive coupling between each word line and the floating gates in its row. To address a particular floating gate between adjacent global bit lines 52 and 53, for example, the word line decoder and driver circuit 19 (FIG. 1) places proper voltages on the word lines 91–103 (FIG. 2) to select the row in which the floating gate exists, and the bit selection line decoder and driver circuit 21 places proper voltages on the bit selection lines 83–86 to turn on the select transistors in the one column in which the addressed floating gate resides but not in the other columns. The global bit line decoder and driver circuit 13 simultaneously places voltages on the global bit lines 52 and 53 that are required for the source and drain of the memory cell in which the addressed floating gate exists.

FIG. 3 provides an enlarged equivalent circuit diagram of a memory cell 105 of the array of FIG. 2. Between adjacent source and drain diffusions 59 and 60 is a series connection of a first floating gate transistor 107, a select transistor 111 and a second floating gate transistor 109. The transistor 107 includes a floating gate 113 and a control gate 115 to which the word line 95 is connected. The select transistor 111 includes a gate 121 to which the bit selection line 84 is connected. The transistor 109 includes a floating gate 117 and a control gate 119 to which the word line 96 is connected. The control gates 115 and 119 of the transistors 107 and 109 preferably have a high degree of capacitive coupling with their respective floating gates 113 and 117. In embodiments where the connection devices 69 and 70 contain pass transistors, those transistors are driven into their conductive states, when the cell 105 is being addressed, to connect its source and drain diffusions 59 and 60 to respective global bit lines 53 and 52, while remaining ones of the connection devices 67–73 (FIG. 2) are maintained in a non-conductive state. In such embodiments, an addressed cell has five transistors connected in series between the global bit lines to which it is connected.

When the floating gate 113 (FIG. 3) of the cell 105 is being addressed for reading or programming its charge level, as an example, the transistor 109 is overdriven by raising the voltage on the word line 96 sufficient to turn on the transistor 109 no matter what charge exists on its floating gate 117. At the same time, the voltage on the bit selection line 84 is raised to turn on the select transistor 111, while the other bit selection lines 83, 85 and 86 (FIG. 2) are maintained at zero volts, or such other voltage as to maintain the select transistors in their columns in a non-conductive state.

For a reading operation, the current-voltage characteristics of the cell 105 (FIG. 3) for different voltage levels on its word line 95 then depend upon the level of charge on the floating gate 113, the quantity to be determined. Unequal voltages are placed on the global bit lines connected to the addressed cell, to typically provide one volt on the diffusion 59 (drain) and zero volts on the diffusion 60 (source), or oppositely, and the current through the cell is monitored to determine the charge level (voltage) of the addressed floating gate. For a programming operation, different voltages are also placed on the global bit lines connected to the addressed cell, typically placing five volts on the diffusion 59 (drain) and zero volts on the diffusion 60 (source), and a positive voltage on the word line 95, to cause electrons to move from the semiconductor substrate onto the floating gate 113 through an intermediate gate dielectric. During either reading or programming, a voltage on the word line 96 overdrives the transistor 109 to render it conductive no matter what charge is on its floating gate 117, and the remaining word lines 91–94 and 97–103 not connected to the addressed cell 105 are maintained a zero volts or some other voltage that deselects those other rows of floating gates.

With the described architecture, any number of floating gates within a selected row are simultaneously programmed. A row is selected by placing an appropriate voltage on its word line and on the second word line of the cells in which the row of floating gates exist, while the voltage on the remaining word lines of the array is maintained at a non-selected level. The cells containing the floating gates of the selected row also have their sources and drains connected to their global bit lines through their connection devices while the sources and drains of the remaining memory cells of the array remain unconnected and their voltages floating. The voltages on the bit selection lines then enable programming of the individual floating gates of the selected row. The voltage placed on the bit selection lines of all the cells of a row to be changed in state turn on the select transistors of those cells, and, as each floating gate becomes programmed, the voltage on the bit selection line of its memory cell is changed to turn off its select transistor so that further programming of that cell is disabled while other floating gates of the selected row continue to be programmed. As described in several of the patents incorporated into the Background of the Invention section above, a reading step is periodically performed during the programming process to ascertain when the individual cells have become programmed.

For reading cells of the described array, a sense amplifier is connected within the circuits 13 (FIG. 1) to every other global bit line. With this arrangement, only one floating gate in a portion of an addressed row spanning two adjacent source and drain segments between global bit lines (8 floating gates in the example of FIG. 2) is read at one time. The reading of an entire row thus takes 8 successive read cycles, in this example.

FIGS. 4–6 illustrate different arrangements of word lines and their connection devices, the word lines 94–97 and connection devices 69 and 70 being illustrated. In FIG. 4, the connection device 69 includes pass transistors 112 and 114 connected in parallel between the diffusion 59 and the global bit line 53, with their gates connected respectively to the word lines 94 and 95. Whenever the voltage on either of the word lines 94 or 95 is high enough to turn on either of their respective transistors 112 or 114, the diffusion 59 is connected to the global bit line 53. Similarly, the connection device 70 includes two pass transistors 116 and 118 connected in parallel in the path between the source and drain diffusion 60 and the global bit line 52. Gates of the transistors 116 and 118 are connected respectively to the word lines 96 and 97. In operation, whenever one of the memory cells connected between the source and drain diffusions 59 and 60 is to be selected for addressing one of its floating gates, those diffusions are connected to their respective global bit lines by raising both of the word lines 94 and 97 to a voltage sufficient to turn on transistors 112 and 118. The word lines 94 and 97 will be recognized to be adjacent to but not part of the row of cells to be selected. Thus, the source and drain diffusions of each segment of the rows of memory cells extending between adjacent global bit lines are controllable by voltages applied to adjacent word lines that are not part of the selected row.

Rather than connecting the gates of the pass transistors of the source and drain connection devices to word lines of the array, as described above and also as illustrated in FIGS. 6 and 7 discussed below, the gates of all such pass transistors can be connected to the word line decoder 19 (FIG. 1). The pass transistors are then individually controlled in response to addresses received from the memory controller 27. However, this requires that a large number of conductors be run between the connection devices and the decoder 19, and increases the size of the decoder. By using voltages of the word lines to control the pass transistors, this added complexity and potential increased area for the array are avoided.

Alternatively, as illustrated in FIG. 5, the connection devices may be conductors that permanently connect each of the source and drain diffusions with its respective global bit line. This simplifies the array structure by eliminating the extra transistors of the connection devices but has the disadvantage of not disconnecting the source and drains from unselected rows of cells. This disconnection is desirable to reduce the incidents where the charge levels of unselected floating gates are disturbed during programming and/or reading of selected floating gates. This permanent connection is suggested when adjacent word lines on opposite sides of source and drain diffusions are connected together, as shown by a connection 120 (word lines 94 and 95) and a connection 122 (word lines 96 and 97). The word lines 94 and 97 adjacent to a row of selected cells are no longer available to turn on the transistors of the connection devices 69 and 70 described with respect to FIG. 4. One reason (another is described below) to provide this adjacent word line strapping is to reduce the number of individual word lines that the word line decoder and driver circuit 19 (FIG. 1) must be able to handle. This reduces the complexity, and thus the size and power consumption, of the circuit 19.

Pass transistors 125 and 127 are included, respectively, in the connection devices 69 and 70 of an alternative arrangement shown in FIG. 6. Even though the adjacent word lines 94/95 and 96/97 are operated together by including the straps 120 and 122, the transistors 125 and 127 can function to control connection of their respective source and drain diffusions 59 and 60. However, in order to turn on the transistors 125 and 127 to pass on the voltage from the global bit lines, the voltage of the word lines connected to their gates needs to be raised to a level that is higher than that of the global bit lines to which they are connected plus the threshold voltage of those transistors. For example, if the global bit line 53 to which the diffusion 59 is connectable is raised to one volt to read the state of the floating gate 113 (FIG. 3), the word lines 94/95 need to be raised to a level of at least that voltage plus the threshold voltage of the transistor 125 in order to turn on that transistor to pass on the global bit line voltage level. Further, if the global bit line 52 to which the diffusion 60 is connectable is raised to five volts during programming the floating gate 113, the word lines 96/97 need to raised to a level in excess of that five volts plus the threshold voltage of the transistor 127. This can place a significant restriction on the range of operating voltages that can be used on the word lines during reading and programming of a floating gate, since those voltages must be made high enough to operate the connection device transistors.

Therefore, another approach that does not have this constraint is illustrated in FIG. 7, where the adjacent word lines 94/95 and 96/97 remain strapped together by respective connections 120 and 122. The connection device 69 includes a pair of transistors 128 and 129 connected in parallel between the diffusion 59 and the global bit line 53. Similarly, the connection device 70 includes a pair of transistors 130 and 131 connected between the diffusion 60 and the global bit line 52. This is similar to the arrangement of FIG. 4, where adjacent word lines are not connected together, but the gates of the connection device transistors are connected to different word lines in FIG. 7 than in FIG. 4. The gate of the transistor 129 is connected to the word line 96, and the gate of the transistor 131 is connected to the word line 95.

If the floating gate 113 (FIG. 3) is being read by application of one volt to the global bit line 53 and zero volts to the bit line 52, the transistor 129 (FIG. 7) is turned on since its gate is connected to the word line 96 of the overdriven floating gate 117 of the selected cell 105, which word line is already being raised to a voltage much higher than one volt in order to make sure that the cell transistor 109 is conductive no matter what charge level exists on its floating gate 117. Since the global bit line 52 to which the transistor 131 is connected is held at zero volts, the voltage on the word line 95 to which its gate is connected need be raised only to a level in excess of the threshold voltage of the transistor 131, which is not a severe constraint on operation of the memory array. During programming of the floating gate 113, in one example, the global bit line 53 is raised to five volts and the global bit line 52 held at zero volts. Since the word line 96 will normally be raised several volts to a rather high level in order to overdrive the floating gate 117, the transistor 129 will also be turned on to pass to the five volt level of the global bit line 53. The transistor 131 is connected to the global bit line 52 of zero potential, so the high voltage on the word line 95 that is used to program the floating gate 113 is more than enough to render the transistor 131 conductive to pass the zero volts. The companion transistor 128 of the connection device 69 has its gate connected with the word line 93 just beyond the adjacent word line 94. Similarly, the transistor 130 of the connection device 70 has its gate connected with the word line 98.

The arrangement of FIG. 7 automatically connects the correct source and drain diffusions to the proper global bit lines in response to normal operating voltages being used on the word lines of the addressed cells. Alternatively, the gates of the pass transistors of the connection devices can be connected to word lines that are not part of the addressed cells that the pass transistors connect to the global bit lines. This then allows the voltages required to turn on the floating gates of the addressed cells to be applied to them independently of the word line voltages required to operate the pass transistors of the addressed cell. The gate of each pass transistor can be connected to a word line that is several word lines away in the y-direction from the word lines on either side of the pass transistor, so as to have an independent voltage to control the gates of the pass transistors. For example, with reference to FIGS. 2 and 7, the gate of the pass transistor 128 can alternatively be connected to the word line 91 and the pass transistor 129 is eliminated. Similarly, the gate of the pass transistor 131 can alternatively be connected to the word line 92 and the pass transistor 130 eliminated. The voltage on the word lines 91 and 92 will not affect the floating gates in their rows since the sources and drains of the cells including those floating gates are unconnected to the global bit lines and are, as a result, floating. As a further variation, the pass transistor gates can be connected to two or more word lines through appropriate logic that results in turning on an individual pass transistor when the necessary voltages are placed on the two or more word lines to which it is connected.

FIG. 8 is a plan view of a portion of the array being described, as implemented on a semiconductor substrate. The same reference numbers are applied to the elements previously described with respect to FIGS. 2–7. Sectional views taken along section I—I through one column of cells having exemplarily floating gates 143, 115, 117, 145, 147 and 148, are given in FIGS. 9A and 11A for different specific embodiments. Similarly, the corresponding sectional views of FIGS. 9B and 11B are taken along section II—II of FIG. 8, through a row of floating gates 149, 117, 151 and 153.

The two global bit lines 52 and 53 shown in FIG. 8 are formed of aluminum, or some other appropriate conducting material, in a layer of the structure above the three polysilicon layers. N+ type diffusions are formed in the substrate under each of the global bit metal lines and spaced apart along their lengths. One N+ diffusion 154 is connected through connection device 70 to the source/drain diffusion 60, and by a contact 155 to the metal global bit line 52 above it. Similarly, N+ diffusions 156 and 158, connected with the metal global bit line 53 by respective contacts 157 and 160, are connected to respective source/drain diffusions 59 and 61 through the connection devices 69 and 71. Each of the global bit lines can alternatively be made of a single buried diffusion (BN+) extending in the y-direction, or of a series of shorter BN+ diffusions that each connect directly, or through pass transistors, with a plurality of source/drain diffusions and which are connected together and/or to a metal line by a BN+ segmentation pass transistor. Since the metal lines 155 and 157 are spaced apart by a plurality of floating gates (four in this example), they present no limitation to scaling the structure.

Referring to the cross-sectional view of FIGS. 9A and 9B, the floating gates are formed from a first layer of doped polycrystalline silicon (polysilicon). The word lines 94–99 are formed from a second layer of polysilicon. The bit selection lines, including line 84, are formed from a third layer of polysilicon. The memory cell 105 is shown to have its floating gates 115 and 117 adjacent and slightly overlapping respective source and drain diffusions 59 and 60. The electric potential on the floating gates 115 and 117 controls conduction through the channel in the substrate 141 between diffusions 59 and 60 in their respective regions L1. The bit selection line 84 forms a select transistor gate 121 that controls the channel portion L2.

FIG. 10 shows a modification of the plan view of FIG. 8, wherein pairs of word lines on opposite sides of source and drain diffusions are connected together. FIG. 10 illustrates one such connection. Different layouts can alternatively be used. The polysilicon word lines 96 and 97 are themselves connected to each other and also connected to a metal line 161 by a contact 165. One such metal line is provided for each pair of word lines. By being periodically connected with metal lines along their lengths, the pairs of word lines can be extended in length from what is possible without use of the metal lines because of the lower resistance and capacitance of the metal lines with other circuit elements. Use of the metal lines lowers a time constant of the word lines, which results in increasing the speed with which the voltage on a word line may be changed. This allows the rows of cells to be increased in length and, therefore, the number of cells to be increased, without reducing the speed at which the array may be operated. These metal lines are elongated in the x-direction and spaced apart in the y-direction. Since, according to current processing technology, the minimum pitch of metal lines is not as small as that of polysilicon lines, a separate metal line for each word line would cause the metal pitch to limit the pitch at which the polysilicon lines could be formed. But by connecting the word lines into pairs, only one-half as many metal lines are required, so the reduced metal line pitch does not limit scaling of the polysilicon lines.

The cross-sectional views of FIGS. 11A and 11B show the structure of FIGS. 9A and 9B with the word lines paired and their metal lines added. Metal lines 159, 161 and 163 are individually connected along their lengths with respective pairs 94/95, 96/97 and 98/99 of word lines. These metal lines are formed in one metal layer that is different from a metal layer in which the global bit metal lines 155 and 157 are formed.

In the cross-sectional views of FIGS. 9A, 9B, 11A and 11B, various dielectric layers between the elements of polysilicon, metal and the substrate are not specifically described but are understood to exist in the spaces between these elements that are included in these figures. In the manufacturing process for the structures of FIGS. 8–11B, an early step is to implant ions in regions that become buried global bit line diffusions (BN+), if any. The structures are designed so that most of the elements are self-aligned with each other. For example, although the pairs of word lines of FIGS. 10, 11A and 11B could be made as single lines that extend over the source and drain diffusions between them, this would prevent self-alignment of the implants for these diffusions with edges of the floating gates and word lines. Advantages of self-alignment include minimizing the size of the array and enabling further improvements in processing technology to be used to make the layout smaller by scaling it proportionately.

Although the first three layers of gates and lines are preferably made of doped polysilicon material, other suitable electrically conductive materials may be used in place of one or more of the three polysilicon layers described. The third layer, for example, from which the bit selection lines are formed, may be a polycide material, which is polysilicon with a conductive refractory metal silicide on its top, such as tungsten, in order to increase its conductivity. This results in the lengths of the bit selection lines, and thus of the lengths of the array columns, to be made longer. Polycides are generally not used in place of either the first or second polysilicon layers because the quality of oxide grown from a polycide is usually not satisfactory.

In one embodiment, after implanting any BN+ global bit line regions, the processing to form the array includes forming and patterning a thick field oxide layer. Gate oxide is then grown on exposed substrate regions and the first polysilicon layer is deposited over the oxide. This polysilicon layer is then etched to form strips of polysilicon having lengths extending in the y-direction and spaces between those strips in the x-direction equal to the desired spaces in that direction between floating gates of the completed array. A layer of interpoly dielectric is formed on the first polysilicon layer strips. This dielectric is preferably oxide-nitride-oxide (ONO). The second layer of polysilicon is then deposited across the structure, a second interpoly dielectric layer formed on its top surface and a mask is then formed on top to allow etching the second interpoly dielectric and polysilicon layers into the word line strips that are elongated in the x-direction and spaced apart in the y-direction. That etching is continued until all the polysilicon and dielectric material is removed from the spaces between the word lines and the substrate is exposed. This also separates the first polysilicon strips into individual floating gates. An implant mask is then formed for the source and drain implants. The alignment of this mask with the other elements is not critical. Ions are then implanted into the substrate by using this mask and the spaces in the y-direction between the second polysilicon word line strips to define the source and drain regions. The floating gates, word lines and the cells' source/drain implants are totally self-aligned with each other by this process.

After the select transistor gate oxide is formed, the third polysilicon layer is then deposited and separated into strips elongated in the y-direction by use of a mask that does not self-align the resulting bit selection lines with other elements of the structure but this alignment is not critical. Because of a high voltage that is likely to be placed between the bit selection lines and the word lines, the interpoly dielectric between the second and third polysilicon layers is made to be rather thick and dielectric spacers are formed along the sides of the word lines formed from the second polysilicon layer. Indeed, a thick dielectric is formed on top of the second polysilicon layer before the second polysilicon layer is patterned into the word line strips. After this patterning, oxide spacers are formed before the first polysilicon layer strips are etched to form the floating gates. The interpoly dielectric and spacers then form part of the first polysilicon etch mask. This results in the word lines having a width that is less than that of the floating gate in the y-direction but its top and side surfaces over which the bit selection lines lie are separated from the bit selection lines by a thick layer of dielectric.

The architecture of the global bit lines and connected source/drain diffusions described above with respect to FIG. 2 can be modified in a manner shown in FIG. 12 to double the number of floating gates whose states can be read at the same time. Each of the global bit lines of FIG. 2 are replaced with two bit lines in FIG. 12. For example, the metal global bit line 52 of FIG. 2 is replaced in FIG. 12 with a pair of parallel metal lines 52' and 52" that are elongated in the y-direction and spaced a narrow distance apart in the x-direction. The line 53 of FIG. 2 is similarly replaced with lines 53' and 53" in FIG. 12. The source/drain diffusions that are connectable through their respective connection devices to a single bit line of FIG. 2 are alternately connected in FIG. 12 to one of a pair of bit lines. For example, instead of the source/drain diffusions 57, 59, 61 and 63 being connectable to the same bit line 53, as they are in FIG. 2, the source/drain diffusions 57 and 61 are connectable in FIG. 12 to the bit line 53' while the source/drain diffusions 59 and 63 are connectable to the bit line 53". The same alternate connection of the other source/drain diffusions of the array exists along the lengths of their respective global bit line pairs.

The advantage of the global bit line pairs of the FIG. 12 embodiment is that two floating gates between adjacent global bit lines can be read at the same time in two different cells whose source and drain diffusions are connected to different ones of the bounding pairs of global bit lines. For example, a cell connected between the source and drain diffusions 57 and 58 is read through the global bit lines 52' and 53', while a cell connected between the source and drain diffusions 59 and 60 is simultaneously read through the global bit lines 52" and 53". Each of the global bit lines of FIG. 12 is connectable to a sense amplifier within the decoder 13 (FIG. 1). The added number of metal lines forming the global bit lines of FIG. 12 takes little additional space when measured on a per cell basis, and will not be an impediment to future scaling of the array since the density of the metal global bit lines in the x-direction remains very low. Indeed, more than two metal lines may be used for each of the global bit lines if the increased performance justifies the additional space and overhead.

The floating gates of the arrays described above may be erased to the bit selection lines by providing a thin tunnel dielectric layer between edges of the floating gates and adjacent select transistor gates, such as edges of the floating gates 115 and 117 that face the select gate 121. In such a structure, the bit selection lines of a block of cells are raised to a high positive voltage to induce electrons to tunnel through the dielectric layers from the floating gates to the adjacent bit selection lines.

It appears preferable, however, to erase the floating gates to the substrate 141 by making the word lines negative with respect to the substrate. This is most conveniently accomplished by holding the substrate at ground potential and connecting a negative voltage in a neighborhood of 20 volts to one or more word lines at a time from the word line decoder and driver circuit 19 (FIG. 1). The floating gates under the word line with a high negative potential are driven negative with respect to the substrate and this causes electrons to travel to the substrate by tunneling through the gate dielectric layers between the floating gates and the substrate. These gate dielectric layers are made to be thin enough for this to easily occur but thick enough to normally function to insulate the floating gates from the substrate.

Alternatively, the memory cell array and peripheral transistors may be formed by a triple well process. By such a process, a p-doped well is formed directly in a lightly doped substrate for the peripheral transistors. The memory array is formed on a second p-doped well that is placed within an n-doped well for isolation. These wells are formed in the surface of the substrate during initial steps of the processing. This separates the memory cell array from peripheral circuits included on the same integrated circuit chip. During erase, the voltage of the array wells is raised to a positive value with respect to the substrate, which is normally maintained at ground potential, and the selected word line(s) then made negative by a lesser amount than above. If a 20 volt difference is desired, the p and n wells of the memory array can be raised to +10 volts and the selected word line(s) to −10 volts. This limits the magnitude of the negative voltage that needs to be generated on the chip. The memory wells are otherwise maintained at the same potential as the substrate during reading and programming operations.

An advantage of the memory array architecture described above is that a single row of floating gates can be erased to the substrate at one time, in the case where each row has a word line whose voltages are individually driven, or two rows of floating gates can be so erased, in the alternative case where pairs of word lines are electrically connected with each other. This allows individual blocks of memory cells to be made quite small and does not require any extensive structure within the array itself to define a block size. Any number of one or more rows, or pairs of rows, may be included in a block as the minimum number of cells that are simultaneously erasable.

Programming of the floating gates is preferably performed by so-called "source side" injection, this being described in the previously referenced U.S. Pat. No. 5,313,421. For application of this technique, each floating gate is positioned adjacent a source and drain diffusion. In other architectures, electrons can be caused to tunnel from the substrate through the floating gate dielectric to the floating gates.

There are at least two techniques for reading the state of an addressed floating gate. One is to raise the word line of the row of the selected floating gate to a fixed voltage and then read the level of the resulting current through the channel of the cell. This current level is related to the level of charge (voltage) on the floating gate. An alternative technique is to raise the voltage of the word line in steps during the reading process, or perform a binary search, and observe when the current flowing through the cell reaches some detectable level. The word line voltage at that occurrence is then related to the level of charge on the floating gate. These alternative techniques are described in the patents and applications that are incorporated by reference into the Background of the Invention section above.

An existing window of floating charge levels, as detected by a reading process, is divided into two or more non-overlapping ranges in order to provide two or more storage states for each floating gate. If two states are established, one-bit of data is stored on each floating gate, two bits in each of the cells of the memory array described above. If more than two states are established, more than one bit of data is stored in each floating gate transistor, resulting in a higher density of data storage in the array. If four states are used, for example, each floating gate stores two bits of data and each cell stores four bits. Such multi-state operation is described in several of the patents identified in the foregoing Background of the Invention section. The dual floating gate cell described in the foregoing array embodiments allows more states to be programmed and read with a higher degree of accuracy than do cells with more than two floating gate transistors connected in series between source and drain diffusions.

The memory architecture described herein has a primary application to non-volatile electrically programmable and erasable floating gate cell arrays. In addition to the examples of such arrays that are discussed above, the architecture can be applied to most any array of cells that provides a pair of source/drain diffusions for individual cells. Further, the architecture described herein has application to read-only-memories (ROMs) that do not have floating gates but are mask programmable by the manufacturer.

Although specific embodiments of the various aspects of the present invention have been described, it is understood that the invention is entitled to protection within the full scope of the appended claims.

It is claimed:

1. A memory system formed on a substrate, comprising:
   a plurality of elongated source and drain diffusions spaced apart in a first direction across the substrate and with lengths extending in a second direction across the substrate, the first and second directions being orthogonal with each other,
   a plurality of memory cells arranged in a plurality of columns extending in the first direction across source and drain diffusions that are a part of the cells, the columns of memory cells being spaced apart in the second direction,
   a plurality of elongated word lines having their lengths extending in the second direction and individually spaced apart in the first direction to overlay individual rows of memory cells to enable their selection,
   a plurality of elongated bit selection lines having their lengths extending in the first direction and individually spaced apart in the second direction to overlay a column of memory cells to enable their selection,
   a plurality of elongated global bit lines having their lengths extending in the first direction and being spaced apart in the second direction with a plurality of columns of memory cells therebetween,
   wherein the source and drain diffusions are segmented along their lengths to individually extend between two global bit lines and be connectable to only one of said two global bit lines through at least one pass transistor having a control terminal connected with at least one of the word lines,
   a plurality of memory cell reading sense amplifiers connectable to the global bit lines, and
   decoder circuits connected to apply voltages to the word and bit selection lines to read at least one memory cell at a time between said two global bit lines or to simultaneously program a plurality of memory cells extending along a selected row across multiple global bit lines.

2. The system of claim 1, wherein said memory cells individually include at least one floating gate capacitively coupled with a corresponding at least one channel region of the substrate located between adjacent ones of the source and drain diffusions and a bit selection line being coupled with an adjacent cell channel region, said at least one floating gate being capacitively coupled with one of the plurality of word lines.

3. The system of claim 2, wherein said memory cells individually include exactly two floating gates capacitively coupled with corresponding channel regions between adjacent source and drain diffusions and adjacent the channel region to which the bit selection line is coupled, each of the two floating gates being capacitively coupled with a different one of the word lines.

4. The system of claim 1, wherein the individual source and drain diffusions form part of the memory cells on opposite sides thereof.

5. The system of any one of claims 1–3, wherein the individual pass transistor control terminals are connected with one of the word lines of a cell to which the source and drain diffusions are connectable therethrough.

6. The system of any one of claims 1–3, wherein the individual pass transistor control terminals are connected with one of the word lines not part of a cell to which the source and drain diffusions are connectable therethrough.

7. The system of claim 6, wherein those word lines adjacent to and on opposite sides of source and drain diffusions are connected together.

8. The system of claim 6, wherein the individual pass transistor control terminals are connected with one of the word lines of a cell removed along a column from a cell to which the source and drain diffusions are connectable therethrough with at least one cell therebetween.

9. The system of claim 1, wherein the plurality of global bit lines individually include at least a pair of global bit line conductors to which the cell source and drain diffusions are connectable, whereby the decoder circuits can read at least two memory cells at a time between said two global bit lines.

10. A non-volatile memory system formed on a substrate, comprising:

plurality of global bit lines extending in a first direction across the substrate and being spaced apart in a second direction across the substrate, the first and second directions being orthogonal with each other, a plurality of elongated source and drain diffusions formed in the substrate with lengths extending in the second direction and being spaced apart in the first direction, said source and drain diffusions individually being connectable with only one of the global bit lines and extending in the second direction less than an entire distance from the one global bit line to which it is connectable and a next adjacent global bit line, a plurality of memory cells arranged in a plurality of columns spanning in the first direction across a plurality of source and drain diffusions and being spaced apart in the second direction in a manner providing a plurality of memory cell columns between adjacent ones of the global bit lines, said memory cells individually including first and second floating gates capacitively coupled with respective first and second channel regions of the substrate located between adjacent ones of the source and drain diffusions with a third channel region between the first and second channel regions, whereby the floating gates are arranged in rows extending in the second direction, said adjacent source and drain diffusions being connectable to different ones of the global bit lines, a plurality of elongated word lines having lengths extending in the second direction and individually spaced apart in the first direction to overlay individual rows of floating gates with capacitive coupling therewith but not overlying the third channel regions, and a plurality of elongated bit selection lines having lengths extending in the first direction and individually spaced apart in the second direction to overlay a column of memory cells in a manner to be capacitively coupled with the substrate in the third channel regions thereof.

11. The system of claim 10, wherein the source and drain diffusions are individually permanently connected with said only one of the global bit lines.

12. The system of claim 10, wherein the source and drain diffusions are individually connectable to designated ones of the global bit lines through individual ones of a plurality of pass transistors.

13. The system of claim 12, wherein said pass transistors are switched between conductive and non-conductive states by voltages applied to their control terminals from selected ones of the word lines to which they are connected.

14. The system of claim 13, wherein said selected ones of the word lines are word lines of cells on opposite sides of a source/drain diffusion from the cells enabled as a result of the pass transistors becoming conductive.

15. The system of claim 13, wherein said selected ones of the word lines are word lines within the cells enabled by the pass transistors becoming conductive.

16. The system of claim 15, wherein said selected word lines within the cells are the word lines of a row of floating gates being enabled.

17. The system of claim 14, wherein said selected word lines within the cells are the word lines of a row of floating gates other than a row of floating gates being enabled.

18. The system of any one of claim 12–17, wherein adjacent source and drain diffusions are connectable through the pass transistors to different adjacent global bit lines in a manner to enable only memory cells connected therebetween.

19. The system of claim 10, wherein the word lines adjacent to and on opposite sides of source and drain diffusions are connected together.

20. The system of claim 19, additionally comprising metal lines elongated in the second direction and spaced apart in the first direction to individually overlay the word lines that are connected together with conductive connections provided therebetween along their lengths.

21. The system of claim 10, additionally comprising metal lines elongated in the first direction and spaced apart in the second direction as part of the global bit lines.

22. The system of any one of claims 10–17, which additionally comprises:

a row decoder receiving addresses over address lines and connected to drive individual addressed word lines with predetermined programming, reading and erase voltages, a column decoder receiving addresses over the address lines and connected to drive individual addressed bit selection lines with predetermined programming, reading and erase voltages, and a plurality of sense amplifiers individually connectable with the global bit lines for reading.

23. The system of claim 22, wherein said row and column decoders drive the word lines and bit selection lines to simultaneously program multiple floating gates in a selected row.

24. The system of claim 22, wherein said row and column decoders drive the word lines and bit selection lines to read at least one memory cell at a time between adjacent global bit lines.

25. The system of claim 22, wherein the row decoder applies to individual ones of the word lines an erase voltage that is negative with respect to the substrate in order to erase the floating gates to which said at least one of the word lines is capacitively coupled.

26. The system of claim 10, wherein a decoding circuit drives a selected one or more of the word lines at a time to a negative voltage with respect to the substrate in order to simultaneously erase the floating gates overlaid by said one or more of the word lines.

27. A non-volatile memory system formed on a substrate, comprising:

a plurality of elongated source and drain diffusions spaced apart in a first direction across the substrate and with lengths extending in a second direction across the substrate, the first and second directions being orthogonal with each other, a plurality of memory cells arranged in a plurality of columns spanning in the first direction across the source and drain diffusions and being spaced apart in the second direction, said memory cells individually including first and second floating gates capacitively coupled with respective first and second channel regions of the substrate located between adjacent ones of the source and drain diffusions with a third channel region between the first and second channel regions, whereby the floating gates are arranged in rows extending in the second direction, a plurality of elongated word lines having lengths extending in the second direction and individually spaced apart in the first direction to overlay individual rows of floating gates with capacitive coupling therewith, a plurality of elongated bit selection lines having lengths extending in the first direction and individually spaced apart in the second direction to overlay a column of memory cells in a manner to be capacitively coupled with the substrate in the third channel regions thereof, and wherein the source and drain diffusions are segmented along their lengths for connection of operating voltages to a selected less than all of the cells in only one row in response to voltages applied to one or more of the word lines.

28. The system of claim 27, wherein said one or more of the word lines to which voltages are applied to connect operating voltages to memory cells are within a memory cell that is being addressed for reading or programming said cell.

29. The system of claim 27, wherein said one or more of the word lines to which voltages are applied to connect operating voltages to memory cells are not within a memory cell that is being addressed for reading or programming said cell.

30. The system of claim 29, wherein said one or more of the word lines to which voltages are applied to connect operating voltages to memory cells are part of a memory cell removed from a memory cell that is being addressed by at least one other cell in between.

* * * * *